United States Patent [19]
Yung

[11] Patent Number: 5,805,097
[45] Date of Patent: *Sep. 8, 1998

[54] CURRENT-INTEGRATING SUCCESSIVE-APPROXIMATION ANALOG-TO-DIGITAL CONVERTER

[75] Inventor: Henry Tin-Hang Yung, Richardson, Tex.

[73] Assignee: Texas Instruments Incorporated, Dallas, Tex.

[*] Notice: The terminal 10 months of this patent has been disclaimed.

[21] Appl. No.: 384,092

[22] Filed: Feb. 6, 1995

[51] Int. Cl.$^6$ ............................................. H03M 1/38
[52] U.S. Cl. ................................................. 341/161
[58] Field of Search .................................. 341/161, 155, 341/158, 166

[56] References Cited

U.S. PATENT DOCUMENTS 3,631,468  12/1971  Spald ............................................. 341/125

*Primary Examiner*—Brian K. Young
*Attorney, Agent, or Firm*—Alan K. Stewart; Richard L. Donaldson; Jay Cantor

[57] ABSTRACT

The current-integrating analog-to-digital converter includes a first charge storage device $C_1$; a second charge storage device $C_2$; an input current $I_{in}$ coupled to the first charge storage device $C_1$ for a first time period; a variable reference current $I_{dac}$ coupled to the second charge storage device $C_2$ for a second time period; and a comparator 20 for comparing the voltage on the first charge storage device $C_1$ with the voltage on the second charge storage device $C_2$.

17 Claims, 1 Drawing Sheet

CURRENT-INTEGRATING SUCCESSIVE-APPROXIMATION ANALOG-TO-DIGITAL CONVERTER

FIELD OF THE INVENTION

This invention generally relates to electronic systems and in particular it relates to analog-to-digital converters.

BACKGROUND OF THE INVENTION

One popular type of analog-to-digital (A/D) converter is the successive-approximation A/D converter. The successive-approximation A/D converter compares a digital-to-analog D/A output with the analog signal. The conversion starts with a D/A output corresponding to a most significant bit (MSB) of "1" and all other bits at "0". This D/A output is compared with the analog signal. If the D/A output is larger, the "1" is removed from the MSB. Then the next most significant bit is set to "1" with all the less significant bits remaining at "0". The corresponding D/A output is again compared with the analog signal. If the D/A output is larger, the "1" is removed from the next most significant bit. This process continues until a "1" is tried in each bit. The binary number remaining at the end of the process is the binary equivalent of the analog signal.

SUMMARY OF THE INVENTION

Generally, and in one form of the invention, the current-integrating analog-to-digital converter includes a first charge storage device; a second charge storage device; an input current coupled to the first charge storage device for a first time period; a variable reference current coupled to the second charge storage device for a second time period; and a comparator for comparing the voltage on the first charge storage device with the voltage on the second charge storage device.

DETAILED DESCRIPTION OF PREFERRED EMBODIMENTS

Figure 1:
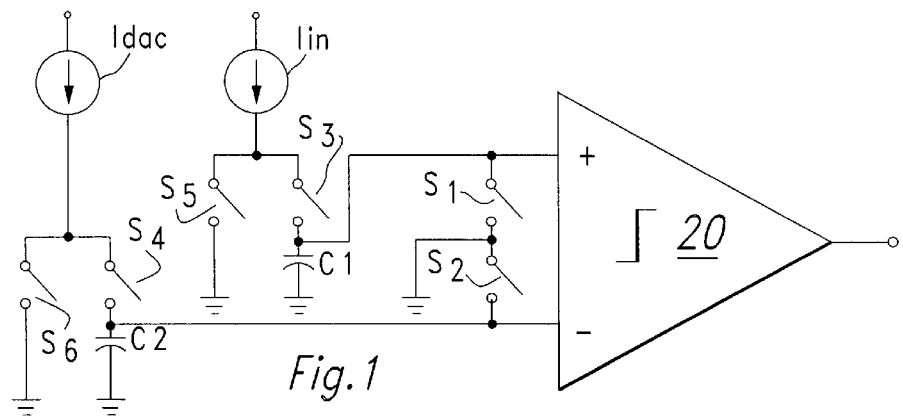
FIG. 1 is a schematic diagram of a first preferred embodiment current-integrating analog-to-digital converter.

Referring to FIG. 1, a circuit diagram of a preferred embodiment current-integrating analog-to-digital converter is shown. The circuit includes comparator 20, currents $I_{dac}$ (variable reference current) and $I_{in}$ (analog input current), capacitors (charge storage devices) $C_1$ and $C_2$ and switches $S_1$–$S_6$. The switches $S_3$ and $S_5$ steer the current $I_{in}$ to either capacitor $C_1$ or ground. When $S_3$ is on, $S_5$ is off, and when $S_5$ is on, $S_3$ is off. Similarly, the switches $S_4$ and $S_6$ steer current $I_{dac}$ to either capacitor $C_2$ or ground. Initially, $S_1$ and $S_2$ are closed to discharge $C_1$ and $C_2$, while $S_3$ and $S_4$ are opened, and $S_5$ and $S_6$ are closed so that the currents $I_{in}$ and $I_{dac}$ flow to ground. Then $S_1$ is opened and $I_{in}$ is directed to $C_1$ for a set period of time such as one clock period T. For a constant $I_{in}$, a charge of ($I_{in} \times T$) will be integrated on $C_1$, giving a voltage of ($I_{in} \times T/C_1$). The current $I_{dac}$ is set to $I_{ref}/2$. With $S_2$ opened, the current $I_{dac}$ is directed to $C_2$ for one clock period, generating a voltage of ($0.5 \times I_{ref} \times T/C_2$). With $C_1$ and $C_2$ equal, the voltage comparator 20 basically compares $I_{in}$ to $I_{ref}/2$. If $I_{in}$ is greater, a "1" will be stored as the most significant bit (MSB). A "0" is registered otherwise. $C_2$ is then discharged and $I_{dac}$ is set to ($3 \times I_{ref}/4$) if the MSB is a "1". $I_{dac}$ is set to $I_{ref}/4$ otherwise. $I_{dac}$ is then used to charge $C_2$ for one clock period and the resulting voltage is compared with ($I_{in} \times T/C_1$) to determine the second MSB. In a similar manner, the remaining bits are determined by this successive approximation method.

In the above scheme, one clock period can be used to discharge the capacitor and one clock period can be given to the comparator to resolve the voltage difference. Thus, each bit would require a total of three clock periods. For instance, an 8-bit converter would need only 24 clock periods to determine all 8 bits. The switches $S_1$, $S_2$, $S_3$, $S_4$, $S_5$, and $S_6$ can be implemented with p-channel MOS transistors. The input current $I_{in}$ can be integrated over multiple clock periods and is not limited to a constant current. If the current is varying, a voltage proportional to the "average" value of $I_{in}$ will appear on $C_1$ as a result of the current integration. The reference current $I_{ref}$ or capacitors $C_1$ and $C_2$ can be scaled to adjust the gain to cover the range of the integrated input current. The current $I_{dac}$ can be generated by a current-output digital-to-analog converter. If $C_1$ is made equal to $C_2$, the conversion scheme will be relatively insensitive to the voltage coefficients of $C_1$ and $C_2$.

Figure 2:
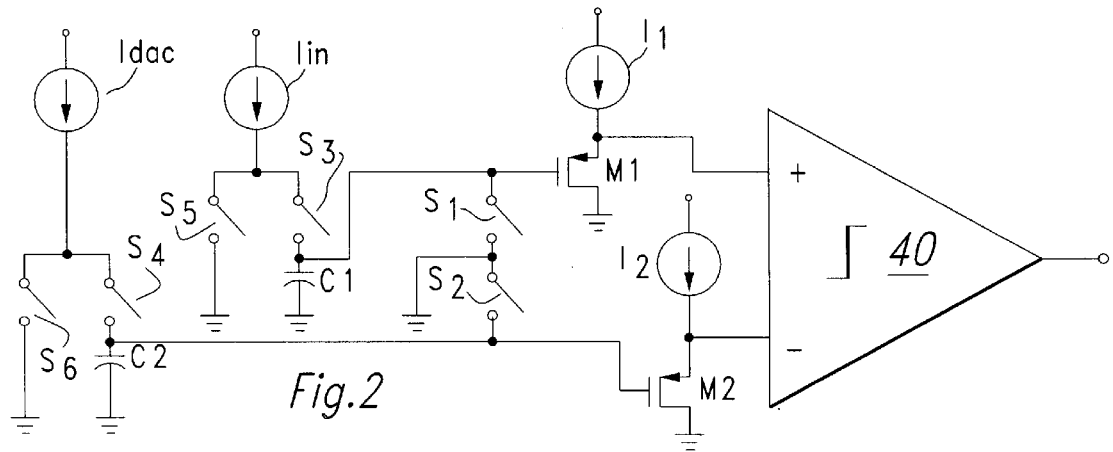
FIG. 2 is a schematic diagram of the first preferred embodiment current-integrating analog-to-digital converter with MOS source followers at the input of the comparator.

For the conversions to be accurate, the comparator needs to have high input impedance and any capacitor coupling of the comparator's output to its input needs to be minimized. To accomplish this, MOS source followers can be used at the input of the comparator 40, as shown in FIG. 2. The circuit of FIG. 2 is the same as the circuit of FIG. 1 with the addition of the MOS source followers which consist of current sources $I_1$ and $I_2$, and transistors $M_1$ and $M_2$.

Figure 3:
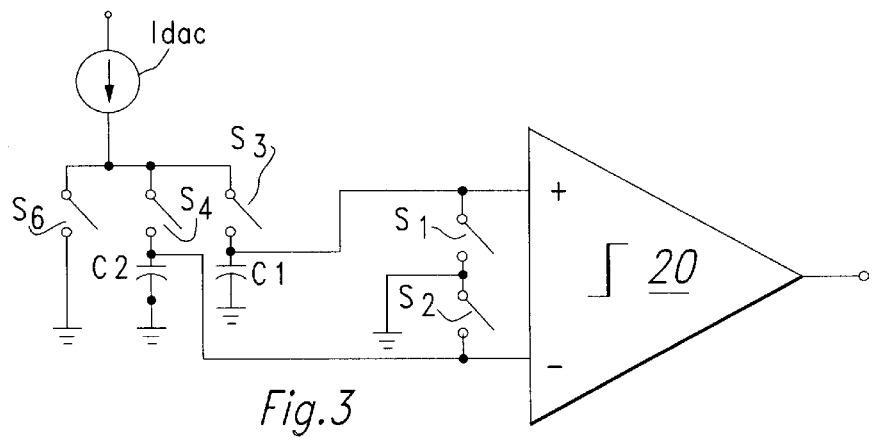
FIG. 3 is a schematic diagram of a second preferred embodiment current-integrating A/D converter used to digitize time/phase difference.

With slight modification, the current-integration A/D converter can be used to digitize time/phase difference. The second preferred embodiment, shown in FIG. 3, can be used to digitize time/phase difference. The circuit in FIG. 3 includes comparator 20, current $I_{dac}$, capacitors $C_1$ and $C_2$, and switches $S_1$–$S_4$ and $S_6$. In this circuit, $I_{dac}$ is used to charge both $C_1$ and $C_2$. If the current $I_{dac}$ is set to $I_{ref}$ and the current is integrated on $C_1$ over a period corresponding to a time difference $T_d$, a voltage of ($I_{ref} \times T_d/C_1$) will be created on $C_1$. This voltage can then be digitized by the successive approximation method described above. The full-scale of the time difference is basically determined by the clock period T. If necessary, the conversion gain can be varied by adjusting $C_1$ and $C_2$, or integrating a current scaled from $I_{ref}$ on $C_1$.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A process comprising:

charging a first capacitor with a first current for a first time period;

charging a second capacitor with a second current for a second time period;

comparing a voltage on the first capacitor with a voltage on the second capacitor;

discharging the second capacitor; and repeating the steps of charging a second capacitor, comparing a voltage, and discharging the second capacitor at least one time, the second current is at a different current level each time the steps are repeated.

2. The process of claim 1 further comprising, after the step of comparing a voltage, providing a logic one if the voltage on the first capacitor is greater than the voltage on the second capacitor and providing a logic zero otherwise.

3. The process of claim 1 wherein the different current levels are selected such that a digital equivalent of the first current is derived.

4. The process of claim 1 wherein the first time period and the second time period are equal.

5. A current-integrating analog-to-digital converter comprising:

a first charge storage device;

a second charge storage device;

an input current coupled to the first charge storage device for a first time period;

a first switch coupled between the input current and the first charge storage device;

a variable reference current coupled to the second charge storage device for a second time period;

a second switch coupled between the variable reference current and the second charge storage device;

a comparator for comparing the voltage on the first charge storage device with the voltage on the second charge storage device.

6. The circuit of claim 5 wherein the first charge storage device and the second charge storage device are capacitors.

7. A current-integrating analog-to-digital converter comprising:

a comparator;

a first capacitor coupled to a first input of the comparator;

a second capacitor coupled to a second input of the comparator;

an analog current input coupled to the first capacitor for a first time period;

a first switch coupled between the analog current input and the first capacitor;

a variable reference current input coupled to the second capacitor for a second time period; and a second switch coupled between the variable reference current input and the second capacitor.

8. The circuit of claim 7 further comprising:

a third switch for discharging the first capacitor; and a fourth switch for discharging the second capacitor.

9. The circuit of claim 7 further comprising:

a third switch for coupling the analog current input to ground; and a fourth switch for coupling the variable reference current input to ground.

10. The circuit of claim 7 wherein the comparator provides a logic one if the analog current input is greater than the variable reference current input, and a logic zero otherwise.

11. The circuit of claim 7 wherein the first and second inputs of the comparator include MOS source followers.

12. The circuit of claim 7 wherein the first capacitor and the second capacitor are the same size.

13. A circuit for digitizing time/phase difference comprising:

a variable reference current;

a first capacitor coupled to the variable reference current for a first time period;

a second capacitor coupled to the variable reference current for a second time period;

a comparator coupled to the first capacitor and coupled to the second capacitor for comparing the voltage on the first capacitor with the voltage on the second capacitor.

14. The circuit of claim 13 further comprising:

a first switch for coupling the variable reference current to the first capacitor;

a second switch for coupling the variable reference current to the second capacitor.

15. The circuit of claim 13 further comprising:

a first switch for discharging the first capacitor; and a second switch for discharging the second capacitor.

16. The circuit of claim 13 wherein the comparator provides a logic one if the voltage on the first capacitor is greater than the voltage on the second capacitor, and a logic zero otherwise.

17. The circuit of claim 13 wherein the first capacitor and the second capacitor are the same size.

* * * * *